(12) United States Patent
Beigel et al.

(10) Patent No.: US 8,609,492 B2
(45) Date of Patent: Dec. 17, 2013

(54) VERTICAL MEMORY CELL

(75) Inventors: Kurt D. Beigel, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/192,207

(22) Filed: Jul. 27, 2011

(65) Prior Publication Data

US 2013/0026562 A1 Jan. 31, 2013

(51) Int. Cl.
*H01L 21/336* (2006.01)

(52) U.S. Cl.
USPC ........... 438/270; 438/242; 438/259; 438/739; 438/740; 257/E21.385; 257/E21.42; 257/E21.431

(58) Field of Classification Search
USPC .......................... 438/739, 740, 242, 259, 270; 257/E21.385, E21.42, E21.431
See application file for complete search history.

(56) References Cited

U.S. PATENT DOCUMENTS

| | | | | |
|---|---|---|---|---|
| 4,920,389 | A | * | 4/1990 | Itoh ............................... 257/302 |
| 5,973,356 | A | * | 10/1999 | Noble et al. ................... 257/319 |
| 6,013,548 | A | * | 1/2000 | Burns et al. .................... 438/242 |
| 6,420,228 | B1 | | 7/2002 | Roesner et al. |
| 7,224,002 | B2 | | 5/2007 | Bhattacharyya |
| 7,728,350 | B2 | | 6/2010 | Bhattacharyya |
| 7,915,673 | B2 | | 3/2011 | Mouli |
| 7,924,630 | B2 | | 4/2011 | Carman |
| 2001/0002062 | A1 | * | 5/2001 | Noble et al. ................... 257/565 |
| 2004/0262635 | A1 | | 12/2004 | Lee |
| 2007/0075359 | A1 | * | 4/2007 | Yoon et al. ..................... 257/329 |
| 2008/0169493 | A1 | * | 7/2008 | Lee et al. ....................... 257/296 |
| 2008/0303083 | A1 | | 12/2008 | Oyu |
| 2010/0144106 | A1 | | 6/2010 | Cho et al. |
| 2010/0207180 | A1 | | 8/2010 | Lee |

FOREIGN PATENT DOCUMENTS

JP    08-064777 A    3/1996

OTHER PUBLICATIONS

U.S. Appl. No. 12/715,704, filed Mar. 2, 2010 (37 pages).
International Search Report and Written Opinion for related PCT Application No. PCT/US2012047214, mailed Jan. 28, 2013, (10 pgs.).

* cited by examiner

*Primary Examiner* — Kenneth Parker
*Assistant Examiner* — David Chen
(74) *Attorney, Agent, or Firm* — Brooks, Cameron & Huebsch, PLLC (57) ABSTRACT

Methods of forming, devices, and apparatus associated with a vertical memory cell are provided. One example method of forming a vertical memory cell can include forming a semiconductor structure over a conductor line. The semiconductor structure can have a first region that includes a first junction between first and second doped materials. An etch-protective material is formed on a first pair of sidewalls of the semiconductor structure above the first region. A volume of the first region is reduced relative to a body region of the semiconductor structure in a first dimension.

11 Claims, 10 Drawing Sheets

VERTICAL MEMORY CELL

CROSS-REFERENCE TO RELATED APPLICATIONS

The present application is related to co-pending U.S. patent application Ser. No. 12/715,704 filed on Mar. 2, 2010, entitled "SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES," the disclosure of which is incorporated by reference herein in its entirety.

TECHNICAL FIELD

The present disclosure relates generally to semiconductor memory devices and methods, and more particularly, to vertical memory cell structures, devices, and methods of forming.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

A vertical memory cell can include an electrically floating body region adjacent control gates. The electrically floating body region can store electrical charge. The presence or absence of electrical charge stored in the electrically floating body region may represent a logic high or binary "1" data state or a logic low or binary "0" data state respectively.

Generally, the greater the volume of the electrically floating body region, the more electrical charge that can be stored therein. However, as vertical memory cells are fabricated at smaller scales, the volume of the electrically floating body region decreases as well. Electrical charge can leak out from the volume of the electrically floating body region, for example, across capacitance leakage paths across junctions involving the electrically floating body region and other doped materials. There is a continuing trend to employ and/or fabricate advanced integrated circuits using techniques, materials, and devices that improve performance, reduce leakage current, and enhance overall scaling. Controlling charge leakage from the volume of the electrically floating body region becomes increasingly more important as the volume of the electrically floating body region decreases since the total quantity of stored electrical charge is reduced with smaller sized devices.

DETAILED DESCRIPTION

Methods of forming, devices, and apparatus associated with a vertical memory cell are provided. One example method of forming a vertical memory cell can include forming a semiconductor structure over a conductor line. The semiconductor structure can have a first region that includes a first junction between first and second doped materials. An etch-protective material is formed on a first pair of sidewalls of the semiconductor structure above the first region. A volume of the first region is reduced relative to a body region of the semiconductor structure in a first dimension.

A vertical memory cell having a reduced a volume of various regions adjacent a body region, as described in the present disclosure, will as a consequence also have reduced junction cross-sectional areas. The reduced volume of the various regions and reduced junction cross-sectional areas are reduced relative to the body region of the vertical memory cell. Reducing the junction cross-sectional areas reduces capacitance across respective junctions, thereby reducing leakages of stored charge away from the body region.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1:
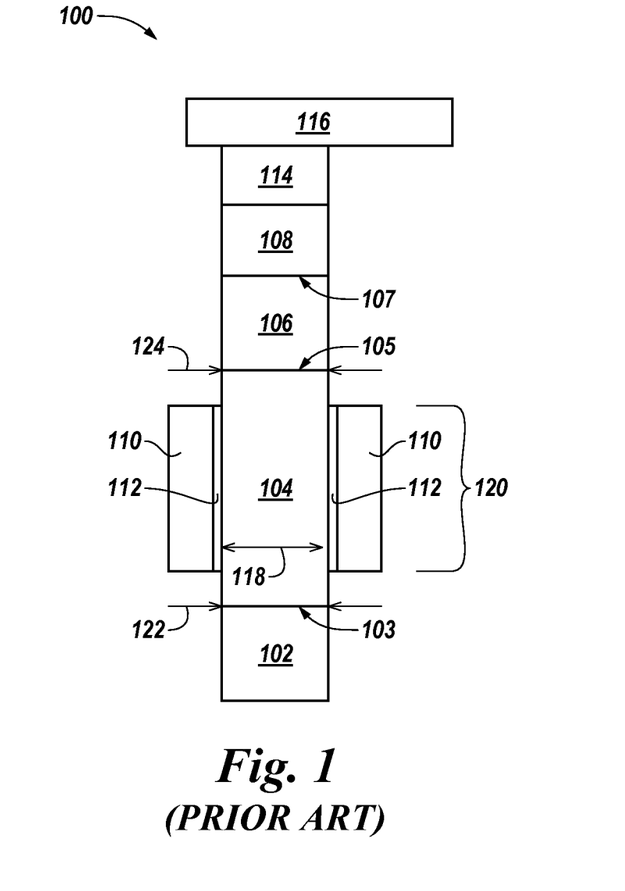
FIG. 1 illustrates a cross-sectional view of a prior art vertical memory cell.

FIG. 1 illustrates a cross-sectional view of a prior art vertical memory cell. FIG. 1 shows a vertical thyristor-based 1T dynamic random access memory (DRAM) cell 100 having an N+ doped material 102, a P-doped material 104, an N− doped material 106, a P+ doped material 108, a contact material 114, and a conductive, e.g., metal, material 116. For example, the metal material 116 can be a data line, e.g., bit line. Between the N+ doped material 102 and the P-doped material 104 is a junction 103. Between the P-doped material 104 and the N− doped material 106 is a junction 105. Between the N− doped material 106 and the P+ doped material 108 is a junction 107.

A gate structure is formed adjacent a portion of the P-doped material 104 including a conductive material 110 separated from the P-doped material 104 by a gate insulator material 112. The portion of the P-doped material 104 adjacent the gate structure is referred to as a body region 120. The body region 120 has a width 118 in a first dimension, and a depth in a second dimension (extending into and out of the plane of FIG. 1 orthogonal to the width 118). The body region 120 has a cross-sectional area of the body region 120, which is equal to the width 118 multiplied by the depth. The body region 120 also has a volume, which is equal to the cross-sectional area multiplied by the height of the body region 120.

The junction 103 has a cross-sectional area equal to a width 122 in a first dimension and a depth in the second dimension. Similarly, the junction 105 has a cross-sectional area equal to a junction width 122 in a first dimension and a depth in the second dimension. The vertical thyristor-based 1T DRAM 100 is shown being fabricated to have a junction width 103 and junction width 105 equal to the width 118 of the body region. Therefore, where the depths of each are also uniform, the cross-sectional areas of the junctions 103 and 105 are equal to the cross-sectional area of the body region 120.

Figure 2A:
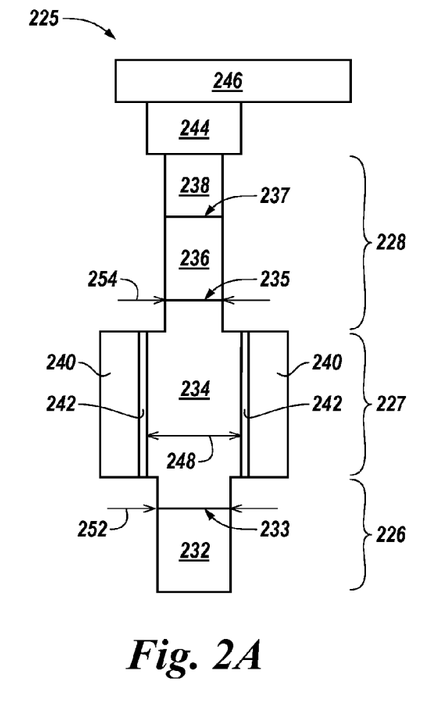
FIGS. 2A-2B illustrate cross-sectional views of vertical memory cells in accordance with embodiments of the present disclosure.
Figure 2B:
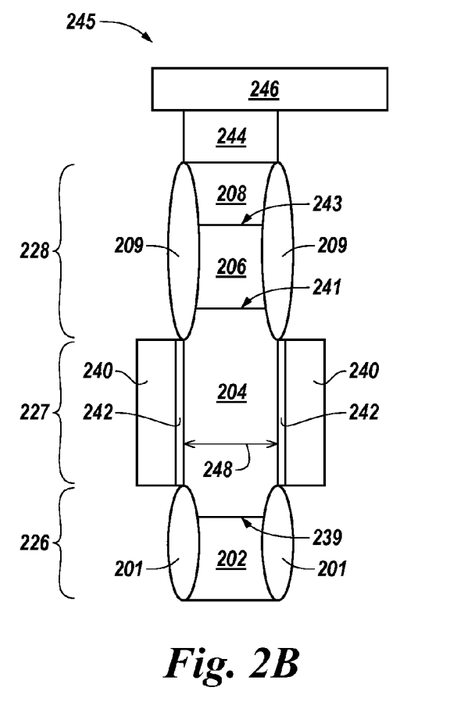

FIGS. 2A-2B illustrate cross-sectional views of vertical memory cells in accordance with embodiments of the present disclosure. FIG. 2A shows a vertical memory cell 225 according to one or more embodiments. The vertical memory cell 225 can be a thyristor-based 1T DRAM, for example. The vertical memory cell 225 can have an N+ doped material 232, a P-doped material 234, an N-doped material 236, a P+ doped material 238, a contact material 244, and a conductive, e.g., metal, material 246 arranged in a vertical structure. The metal material 246 can be a bit line, for example. Between the N+ doped material 232 and the P-doped material 234 is a junction 233. Between the P-doped material 234 and the N− doped material 236 is a junction 235. Between the N− doped material 236 and the P+ doped material 238 is a junction 237.

One or more control gate structures can be formed adjacent a portion of the P-doped material 234 including a conductive material 240 separated from the P-doped material 234 by a gate insulator material 242. The conductive material 240 can be, or can be coupled to, access lines, e.g., word lines, of the vertical memory cell, for example. Conductive materials mentioned in this disclosure may include low resistivity materials including, but not limited to, a phase change material, titanium, titanium silicide, titanium oxide, titanium nitride, tantalum, tantalum silicide, tantalum oxide, tantalum nitride, tungsten, tungsten silicide, tungsten oxide, tungsten nitride, other metal, metal silicide, metal oxide, or metal nitride materials, or combinations thereof, including multiple different conductive materials.

The portion of the P-doped material 234 adjacent the control gate structures is referred to as a body region 227. A portion of the vertical memory cell 225 below the control gate structures that includes the junction 233 is referred to as a first region 226. A portion of the vertical memory cell 225 above the control gate structures that includes the junction 235, and can include the junction 237, is referred to as a second region 228.

The body region 227 has a width 248 in a first dimension and a depth in a second dimension (extending into and out of the plane of FIG. 2A orthogonal to the width 248). The body region 227 has a cross-sectional area that is equal to the width 248 multiplied by the body region depth. The body region 227 also has a volume that is equal to the cross-sectional area of the body region 227 multiplied by the height of the body region 227.

The junction 233 has a cross-sectional area equal to a width 252 in a first dimension and a depth in the second dimension. Similarly, the junction 235 has a cross-sectional area equal to a junction width 254 in a first dimension and a depth in the second dimension. The vertical memory cell 225 is shown being fabricated to have a junction width 252 that is less than the width 248 of the body region 227. As such, the cross-sectional area of the junction 233 can be less than the cross-sectional area of the body region 227 (for uniform junction 233 and body region 227 depths).

The vertical memory cell 225 is shown being fabricated to have a junction width 254 that can be less than the width 248. As such, the cross-sectional area of the junction 235 can be less than the cross-sectional area of the body region 227 (for uniform junction 235 and body region 227 depths). The vertical memory cell 225 is also shown being fabricated to have a junction width 254 that can be less than the junction width 252. As such, the cross-sectional area of junction 235 can be less than the cross-sectional area of junction 235 (for uniform junction 233 and junction 235 depths). However, embodiments of the present disclosure are not so limited. For instance. junction width 254 can be the same, equal to, or greater than, junction width 252. The cross-sectional area of junction 235 can be the same, equal to, or greater than, the cross-sectional area of junction 233.

The vertical memory cell 225 is shown being fabricated to have a junction 237 having a width that is similar to width 254 of junction 235. The junction 237 can also have a depth, in the second dimension that is the same as the depth of junction 235. As such, the cross-sectional area of junction 237 can be equal to the cross-sectional area of junction 235. However, embodiments of the present disclosure are not so limited, and the cross-sectional area of junction 237 can be the same, or greater, than the cross-sectional area of the first and/or second junctions 233 and 235.

The body region 227 of the vertical memory cell 225 can be electrically floating and can store electrical charge. The presence of electrical charge stored in the body region 227 can represent one logical data state, e.g., "1," for example. The absence of electrical charge in the electrically floating body region 227 can represent another logical data state, e.g., "0," for example.

The quantity of charge that can be stored in the body region 227 is related to the volume of the body region 227. The volume of the body region 227 is proportional to the height, width 248 and depth of the body region. However, electrical charge can leak out from the volume of the body region 227, for example, via capacitance leakage paths across junctions adjacent the body region, such as junctions 233 and/or 235. Generally, the greater the dimensions of a volume, the greater the cross-sectional area of a junction involving the volume. The greater the cross-sectional area of a junction, the greater the junction capacitance, and the faster charge stored in the volume of the body region 227 can leak out.

Providing a vertical memory cell having a sufficient volume 234 of the body region 227, i.e., providing a body region having large dimensions, in support of improved charge-storing capacity can conflict with providing small cross-sectional areas of junctions involving the body region 227, e.g., junction 233 and junction 235. However, the techniques of the present disclosure simultaneously satisfy providing a large volume of the body region 227 while reducing junction cross-sectional area of the body region 227 for a given vertical memory cell size. It can be seen that the vertical memory cell 225 shown in FIG. 2A satisfies these simultaneous constraints by reducing the widths (and cross-sectional areas) of junctions 233 and 235 relative to the width 248 (and cross-sectional area) of the body region 227. The widths (and cross-sectional areas) of junctions 233 and 235 can be reduced relative to the width 248 (and cross-sectional area) of the body region 227 by the techniques described with respect to FIGS. 3A-3H, for instance.

Retention of a vertical thyristor-based DRAM, such as vertical memory cell 225, is based on the cross-sectional areas of junctions 233 and 235, as discussed above, e.g., reducing stored charge leakage improves charge retention, and thus, data and/or logic state retention. Performance of a vertical thyristor-based DRAM, such as vertical memory cell 225, can be improved by providing a large capacitance across the control gate structures, i.e., across the gate dielectric 242, relative to the capacitance across junctions 233 and 235. Therefore, providing reduced widths, and thereby reduced cross-sectional areas, of junctions 233 and 235, as compared to previous vertical memory cells such as cell 100 shown in FIG. 1.

FIG. 2B shows a vertical memory cell 245 according to one or more embodiments of the present disclosure. The vertical memory cell 245 can be a thyristor-based 1T DRAM, for example. The vertical memory cell 245 can have an N+ doped material 202, a P-doped material 204, an N− doped material 206, a P+ doped material 208, a contact material 244, and a conductive, e.g., metal, material 246 arranged in a vertical structure. The metal material 246 can be, or can be coupled to, a bit line, for example. Between the N+ doped material 202 and the P-doped material 204 is a junction 239. Between the P-doped material 204 and the N-doped material 206 is a junction 241. Between the N− doped material 206 and the P+ doped material 208 is a junction 243.

One or more control gate structures can be formed adjacent a portion of the P-doped material 204 including a conductive material 240 separated from the P-doped material 204 by a gate insulator material 242. The conductive material 240 can be, or can be coupled to, word lines of the vertical memory cell, for example. The portion of the P-doped material 204 adjacent the control gate structure is referred to as a body region 227. A portion of the vertical memory cell 245 below the control gate structures that includes junction 239 is referred to as a first region 226. A portion of the vertical memory cell 245 above the control gate structures that includes junction 241, and can include junction 243, is referred to as a second region 228.

The body region 227 has a width 248 in a first dimension, and a depth in a second dimension (extending into and out of the plane of FIG. 2B orthogonal to the width 248). The body region 227 has a cross-sectional area, which is equal to the width 248 multiplied by the depth of the body region. The body region 227 also has a volume, which is equal to the cross-section multiplied of the body region 227 by the height of the body region 227.

Junction 239 has a cross-sectional area equal to width 239 in a first dimension and a depth of the first junction in the second dimension. Junction 241 has a cross-sectional area equal to width 241 in a first dimension and a depth in the second dimension. The vertical memory cell 245 is shown being fabricated to have width 239 being less than width 248. Width 239 is reduced by oxidation material 201. Oxidation material 201 can be formed by oxidization of the first region 226, such that some volume of the N+ doped material 202 and the P-doped material 204 is consumed, thereby reducing the width and cross-sectional area between the N+ doped material 202 and the P-doped material 204, i.e., junction 239. The cross-sectional area of junction 239 can be fabricated to be less than the cross-sectional area of the body region 227.

Vertical memory cell 245 is shown being fabricated to have a width of junction 241 that can be less than width 248 of the body region 227. As such, the cross-sectional area of junction 241 can be less than the cross-sectional area of the body region 227 (for uniform junction 241 and body region 227 depths). The vertical memory cell 245 is also shown being fabricated to have the width of junction 241 that can be less than the width of junction 239. As such, the cross-sectional area of junction 241 can be less than the cross-sectional area of junction 239 (for uniform junction 239 and junction 241 depths). However, embodiments of the present disclosure are not so limited. The width (and cross-sectional area) of junction 241 can be the same, equal to, or greater than, the width (and cross-sectional area) of junction 239.

Vertical memory cell 245 is also shown being fabricated to have a junction 243 having a width that is similar to the width of junction 241. Junction 243 can also have a depth in the second dimension that is the same as the depth of junction 241. As such, the cross-sectional area of junction 243 can be equal to the cross-sectional area of junction 241. However, embodiments of the present disclosure are not so limited, and the cross-sectional area of the junction 237 can be the same, less than, or greater than, the cross-sectional area of junctions 239 and/or 241.

The width of junction 241 and/or junction 243 can be reduced by oxidation material 209. Oxidation material 209 can be formed by oxidization of the second region 228, such that some volume of the N-doped material 206 and the P+ doped material 208 is consumed, thereby reducing the width and cross-sectional area between the N-doped material 206 and the P+ doped material 208, i.e., the junctions 241 and 243. The cross-sectional area of junctions 241 and 243 can be less than the cross-sectional area of the body region 227.

The body region 227 of vertical memory cell 245 can be electrically floating and store electrical charge. The quantity of electrical charge stored in the body region 227 can represent various logical data states. As discussed in detail with respect to FIG. 2A, the widths (and cross-sectional areas) of the junctions, e.g., 239, 241 and/or 243, can be reduced relative to the width 248 (and cross-sectional area) of the body region 227 by the techniques described with respect to FIGS. 3A-3H, including various oxidation processes to consume the various semiconductor materials in the vicinity of the respective junctions.

Figure 3A:
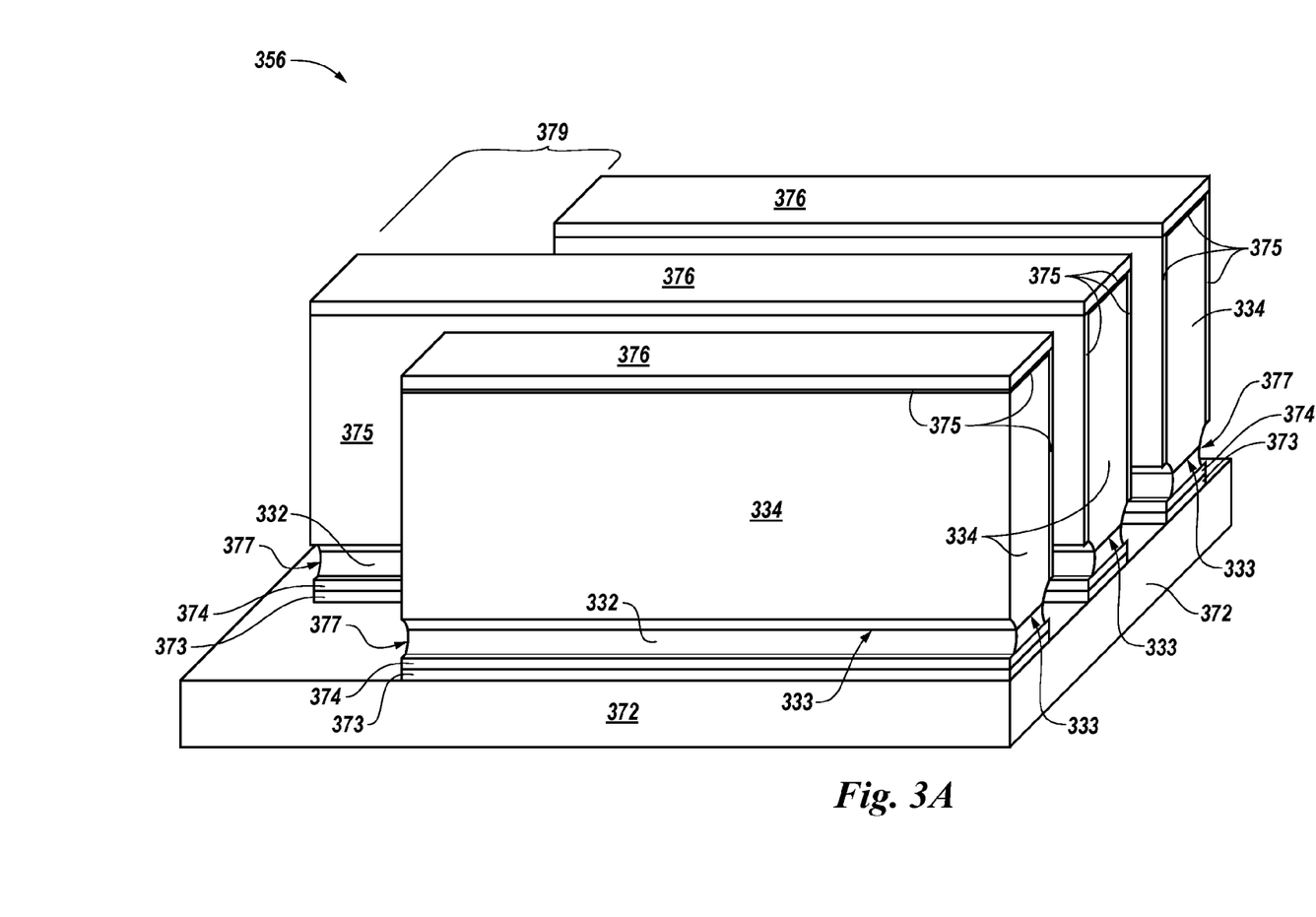
FIGS. 3A-3H illustrate process stages associated with forming a vertical memory cell in accordance with embodiments of the present disclosure.

FIGS. 3A-3H illustrate process stages associated with forming a vertical memory in accordance with embodiments of the present disclosure. FIG. 3A shows an early stage of formation of a vertical memory cell structure 356. Some material processing has previously occurred in formation of the vertical memory cell structure 356 shown in FIG. 3A, as is described below. Vertical memory cell structure 356 can include a buried oxide 372, a bonding material 373 over the buried oxide 372, a conductive material 374 over the bonding material 373, and a semiconductor structure over the conductive material 374.

The semiconductor structure can include materials 332 and 334, which may be doped. The bonding material 373 and conductive material 374 have been patterned and formed into various lines on the buried oxide 372. According to some embodiments, the conductive material 374 can be a buried cathode line. Semiconductor materials, such as materials 332 and 334, can be deposited, patterned, and formed into the semiconductor structure corresponding to the lines of conductive material 374. According to various embodiments, material 332 can be an N+ doped material and material 334 can be a P-doped material. A junction 333 is located between material 332 and material 334. According to some embodiments, the N+ doped material 332 can be a cathode of a vertical memory cell.

The materials described herein may be formed by various techniques including, but not limited to, spin coating, blanket coating, chemical vapor deposition ("CVD") such as low pressure CVD or plasma enhanced CVD, plasma enhanced chemical vapor deposition ("PECVD"), atomic layer deposition ("ALD"), plasma enhanced ALD, physical vapor deposition ("PVD"), thermal decomposition, and/or thermal growth, among others. Alternatively, materials may be grown in situ. While the materials described and illustrated herein may be formed as layers, the materials are not limited thereto and may be formed in other three-dimensional configurations.

Doped materials 332 and 334 can be, for example, at least one of germanium (Ge), silicon (S), silicon carbide (SiC), and/or gallium nitride (GaN), among various other semiconductor materials or combinations thereof. According to some embodiments, material 332 and material 334 can be deposited separately. According to some embodiments, a precursor semiconductor material may be deposited and subsequently implanted with an atomic species to form a particular doped region.

The vertical memory cell structure 356 shown in FIG. 3A can be a semiconductor-on-insulator (SOI) or semiconductor-metal-on-insulator (SMUT), such as is described in co-pending U.S. patent application Ser. No. 12/715,704, filed on Mar. 2, 2010, entitled "SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES," among other configurations.

The buried oxide 372 of an SMOI structure can include, for example, an insulator material on a semiconductor substrate. The semiconductor substrate can be a full or partial wafer of semiconductor material such as silicon, gallium arsenide, indium phosphide, etc., a full or partial silicon-metal-on-insulator (SMUT) type substrate, such as a silicon-on-glass (SOG), silicon-on-ceramic (SOC), or silicon-on-sapphire (SOS) substrate, or other suitable fabrication substrate. As used herein, the term "wafer" includes conventional wafers as well as other bulk semiconductor substrates. The insulator material may be a dielectric material including, by way of non-limiting example, silicon dioxide, borophosphosilicate glass (BPSG), borosilicate glass (BSG), phospho silicate glass (PSG) or the like.

The bonding material 373 can be an amorphous silicon material bonded to the insulator material, with the conductive material 374 being formed over the amorphous silicon material, and a semiconductor substrate material formed over the conductive material 374. The semiconductor substrate material can be patterned and formed into the semiconductor structure shown in FIG. 3A.

The SMOI structure formed in accordance with the various embodiments of the present disclosure can include an amorphous silicon material that exothermically crystallizes or reacts with the insulator material and/or the conductive material 374, which allows for silicon atom rearrangement. Such silicon atom rearrangement can improve the bond strength at the interface between the amorphous silicon material, the insulator material, and/or the conductive material. As such, the bond created between the amorphous silicon material and the insulator material and/or the conductive material 374 may be substantially stronger than a bond created between two insulator materials, such as two oxide materials.

As shown in FIG. 3A, the SMOI structure can result in the conductive material 374 being disposed between the insulator material of the buried oxide 372 and the semiconductor structure. That is, the conductive material 374 is buried beneath the semiconductor structure. The conductive material 374 may be used, in some embodiments, to form an interconnect, such as a word line or a bit line, or to form a metal strap. Such an interconnect may be used to facilitate access to a semiconductor device ultimately formed from the semiconductor structure. Embodiments of the present disclosure are not limited to any particular configuration of the conductive material 374, including SOI and/or SMOI configurations. That is, various methods and/or configurations can be utilized to fabricate a buried conductor below the semiconductor structure.

The vertical memory cell structure 356 can include multiple instances of bonding material 373, conductive material 374, and a semiconductor structure formed over the over the buried oxide 372, as shown in FIG. 3A. The number of such instances is not limited to the three shown in FIG. 3A, which are limited in quantity for simplicity and illustration of the fabrication techniques, and can include more. Alternate instances of bonding material 373, conductive material 374, and semiconductor structures formed over the over the buried oxide 372 can be offset in one direction from one another, as shown at the left side of FIG. 3A by a distance indicated by bracket 379. Although not shown in FIG. 3A, in order to show internal configurations, instances of bonding material 373, conductive material 374, and semiconductor structures formed over the buried oxide 372 can be offset in the same direction from one another on a right side of each structure. Such offset can be used for communicably coupling some or all alternate instances to a common communication path, such as by an additional conductive material structure, for instance.

The vertical memory cell structure 356 shown in FIG. 3A can be formed by, for example, forming instances of bonding material 373, conductive material 374, and a semiconductor structure formed over the over the buried oxide 372, then depositing bulk material 332 and material 334 thereover, and patterning and etching the materials 332 and 334 into the semiconductor structures corresponding to the instances of conductive material 374. The etching process used to form the semiconductor structures can include several separate etching processes.

The vertical memory cell structure 356 shows an etch-protective material 375, such as a polymer or oxide liner, on the sidewalls of the semiconductor structure. A patterning mask 376, such as a nitride cap, is shown on the top of each semiconductor structure, e.g., silicon line. The etch-protective material 375 is also located between material 334 and the patterning mask 376.

The vertical memory cell structure 356 shown in FIG. 3A can be formed from the bulk materials 332 and 334 deposited over the instances of bonding material 373 and conductive material 374. For example, trenches can be patterned and etched into material 334 corresponding to respective instances of conductive material 374. The trenches can be etched into material 334 to a depth just above junction 333. Etching trenches into material 334 can be accomplished by, for example, a reactive ion etch stopping near junction 333. The etch-protective material 375 can then be deposited over the etched material 334 such that it covers the sidewalls and top of material 334. The patterning mask 376 can then be deposited on top of the semiconductor structures over the etch-protective material 375 on top of material 334.

Remaining bulk materials 332 and 334 can be further etched into the semiconductor structures shown in FIG. 3A using another etch, e.g., reactive ion etch, to the buried oxide 372. The patterning mask 376 functions as a pattern, and the etch-protective material 375 protects the portion of the sidewalls of material 334, which is covered by the etch-protective material 375 during the subsequent etch to the buried oxide 372. According to certain embodiments, the etch-protective material 375 covers the sidewalls of material 334 to a location corresponding to where a bottom edge of future control gate structures will be formed. In other words, the etch-protective material 375 covers the sidewalls of material 334 except for portions of material 334 included in the first region, e.g., FIG. 2A at 226.

The subsequent etch to the buried oxide 372 removes not only bulk materials 332 and 334 not corresponding to respective conductive material 374, but also some volume of the bulk materials 332 and 334 corresponding to respective conductive material 374. That is, the subsequent etch to the buried oxide 372 can reduce a volume of the first region relative to the body region (covered by the etch-protective material 375 during the subsequent etch to the buried oxide 372). The subsequent etch to the buried oxide 372 effectively undercuts materials 332 and 334 of the semiconductor structure in one dimension, e.g., the dimension being oriented into and out of the plane of FIG. 3A and corresponding to the second dimension described with respect to FIGS. 2A and 2B. The first dimension, as was also described with respect to FIGS. 2A and 2B, is in a horizontal direction across FIG. 3A.

The volume of the first region reduced relative to the body region is shown at 377 in FIG. 3A, which occurs on opposite sidewalls of each instance of the semiconductor structure, as can be seen from at the right end of each illustrated semiconductor structure. Reducing the volume of the first region relative to the body region in this manner operates to reduce the cross-sectional area of junction 333, e.g., a P-N junction, since the first region is not protected by the etch-protective material 375 and includes junction 333. Reducing the volume of the first region relative to the body region reduces one of the dimensions associated with the cross-sectional area of junction 333, e.g., depth of junction 333. Reducing the volume of the first region relative to the body region by the subsequent etch to the buried oxide 372, after protecting the sidewalls of the bulk materials 334, does not tend to reduce the volume in the body region, e.g., FIG. 2A at 227, of the material 334.

Similar to the description provided above with respect to FIG. 2B, the width of junction 333 can be reduced by oxidizing the first region such that some volume of the materials 332 and 334 is consumed. Such an oxidation can occur in conjunction with some etching, e.g., reactive ion etching. For example, a reactive ion etch can initially be used to remove bulk materials 332 and 334 that do not correspond to a respective conductive material 374. Thereafter, exposed materials 332 and 334 of the semiconductor structures can be oxidized to consume some volume of the materials 332 and 334 corresponding to a respective conductive material 374, thereby reducing the width and cross-sectional area of junction 333.

Figure 3B:
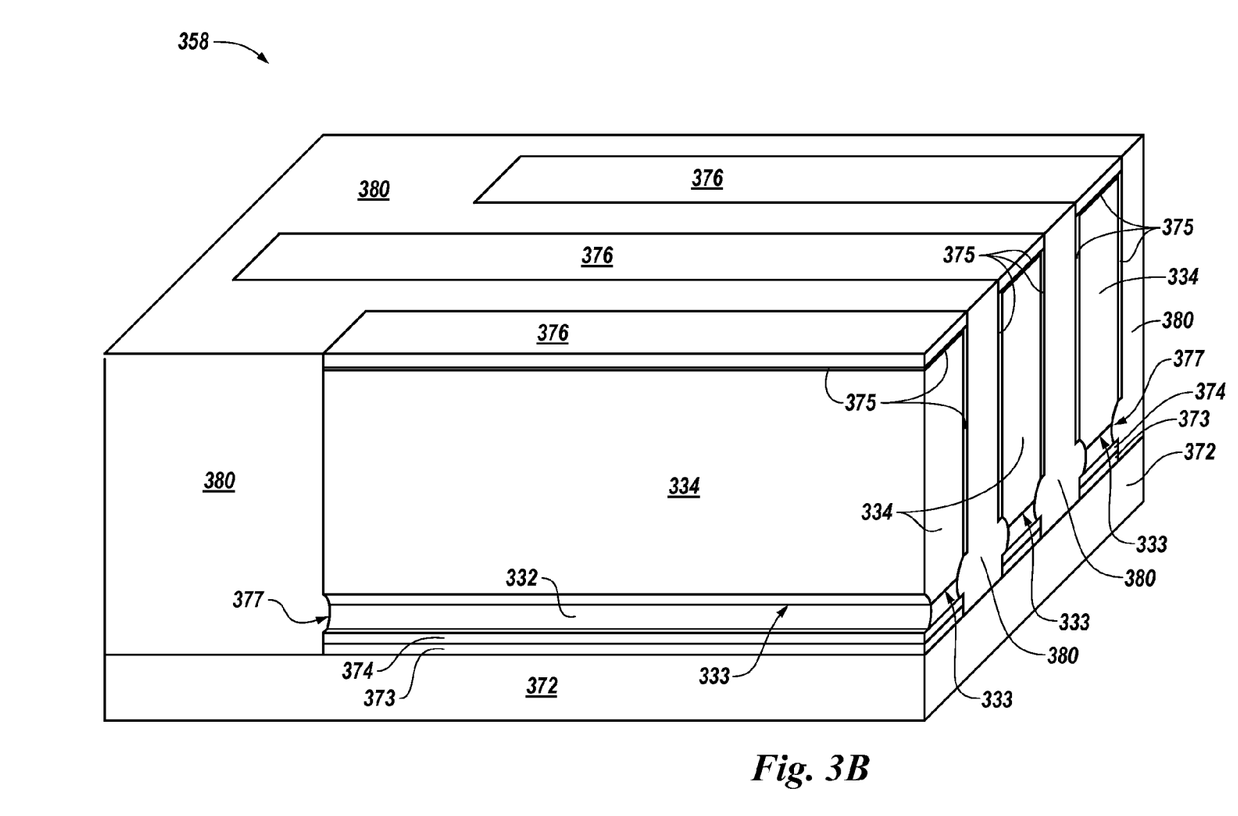
Figure 3C:
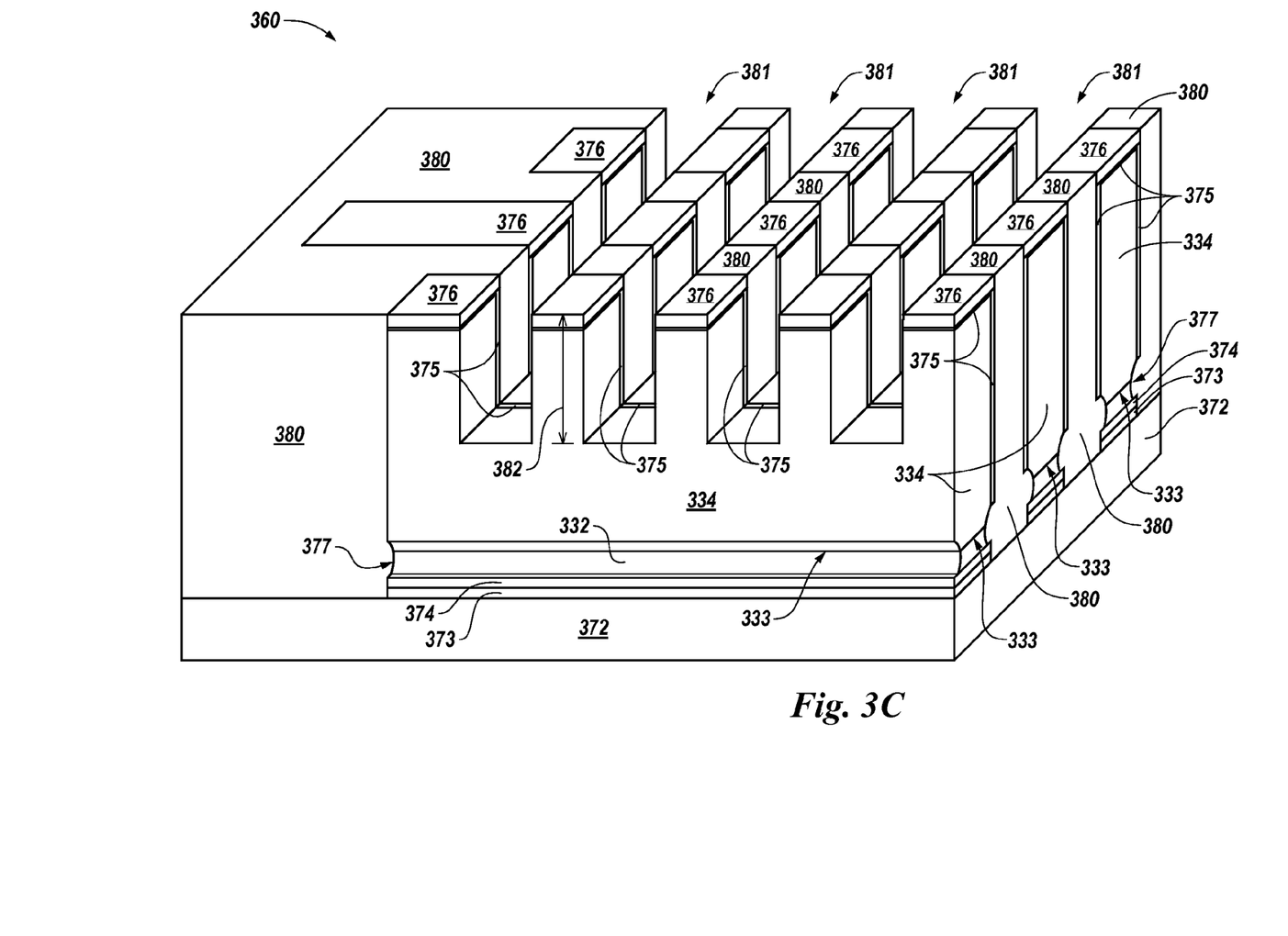
Figure 3D:
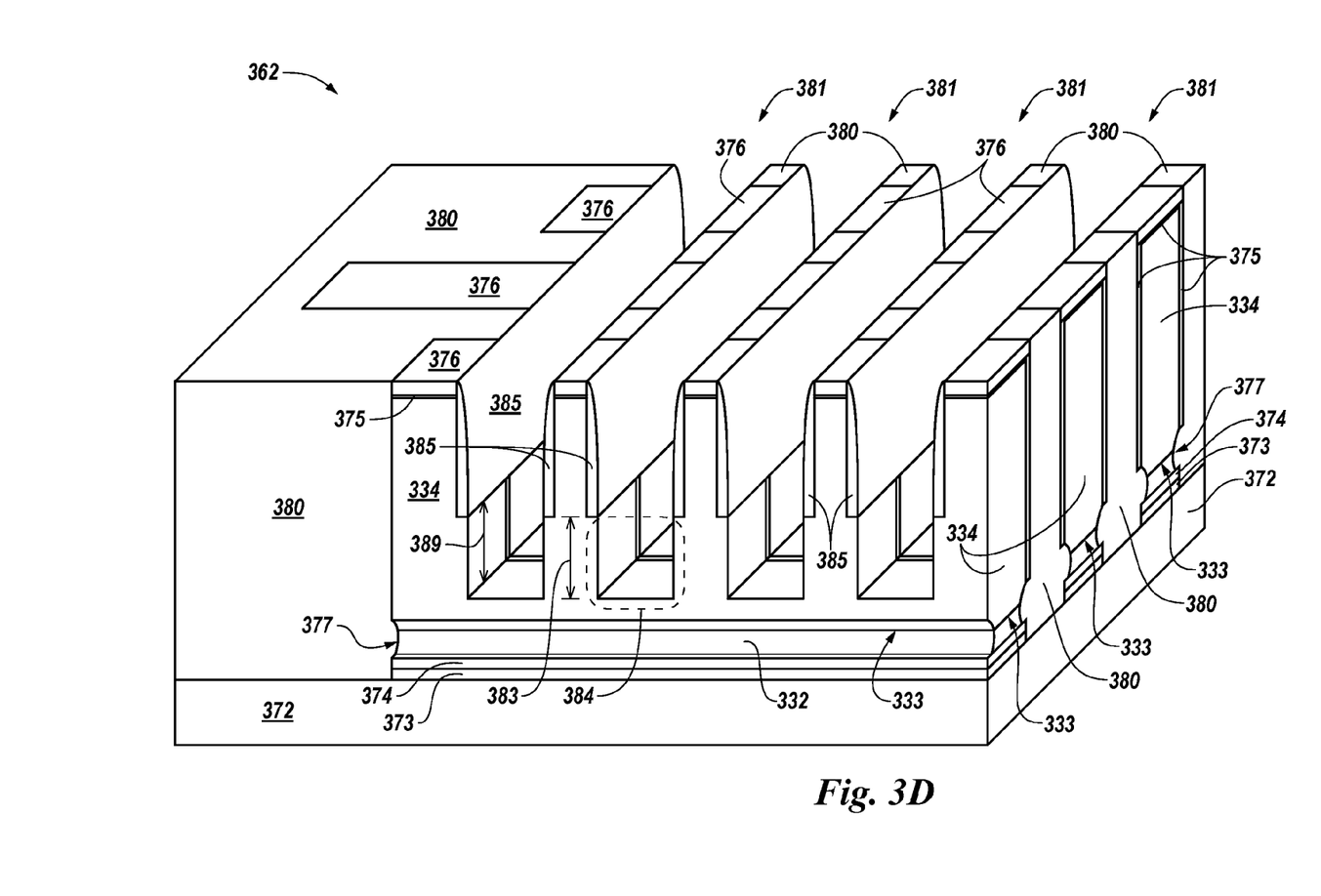
Figure 3E:
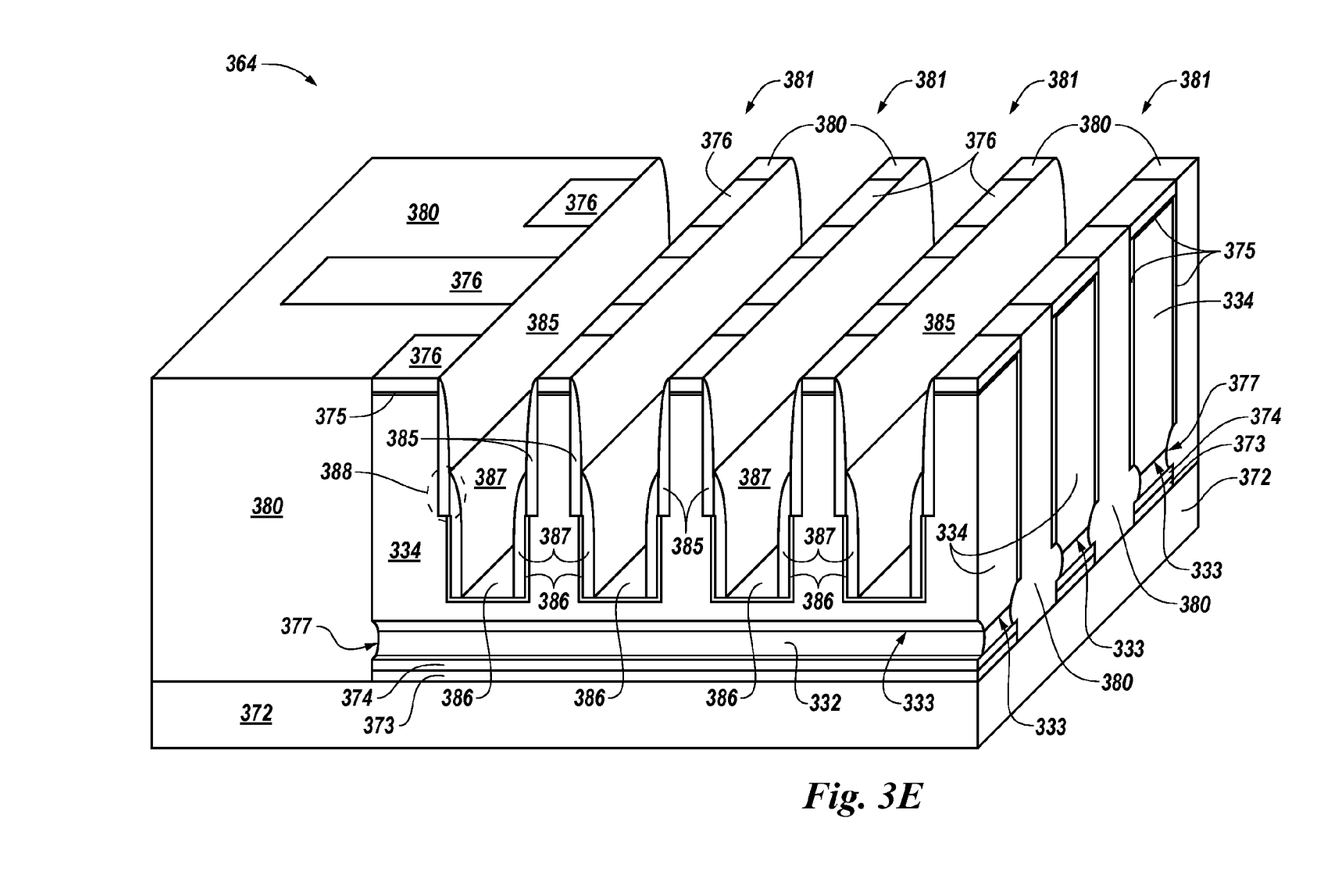
Figure 3F:
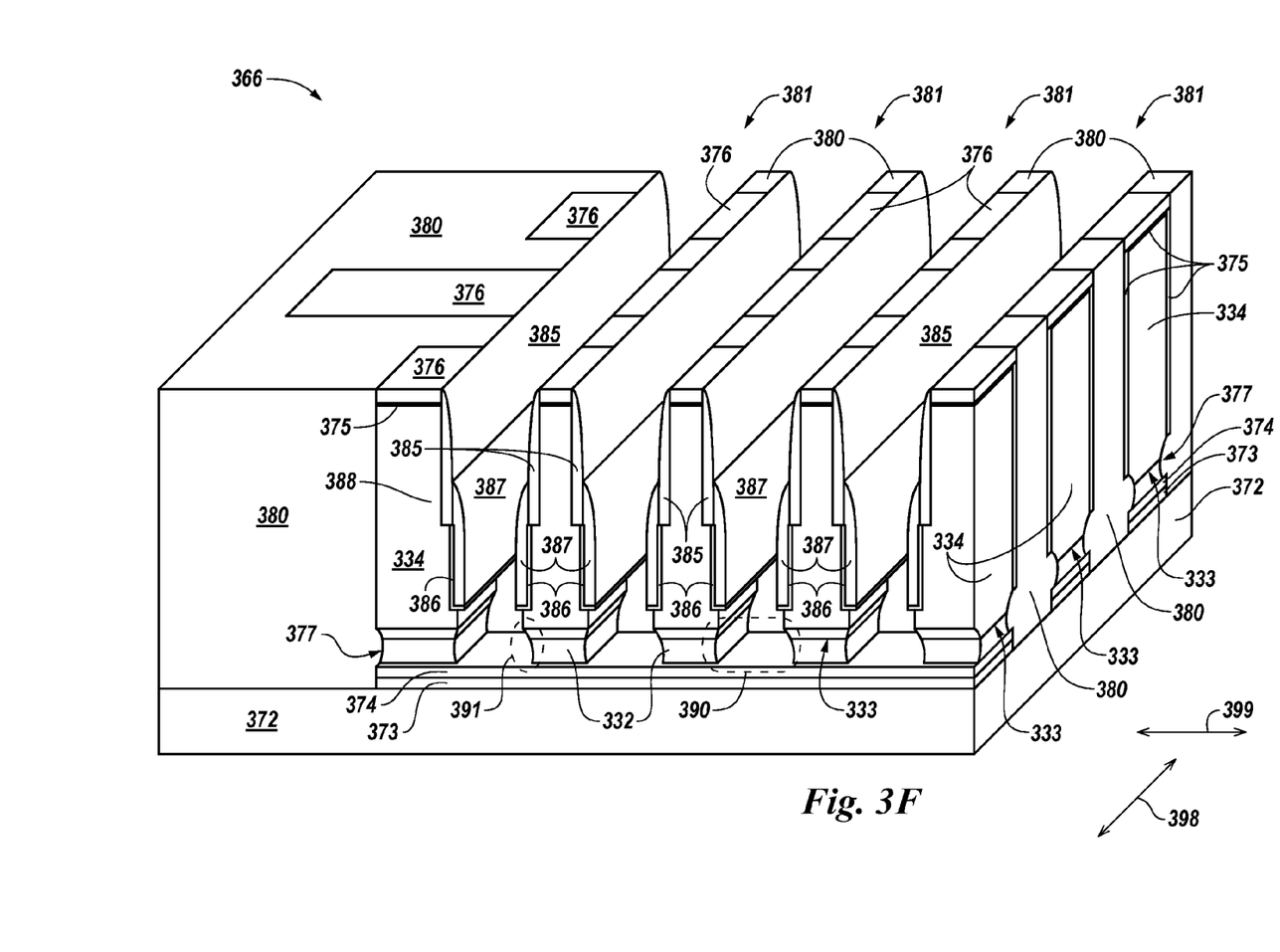

Alternatively, oxidation can occur at sometime later in processing, for example, simultaneous to when an insulator material spacer 385, e.g., as shown in FIG. 3D, is formed by oxidation, or after trench 390 is formed by etching (but before any undercutting of the materials 332 and 334 thereby as shown in FIG. 3F), so that volumes of the first region in two dimensions can be reduced by oxidation simultaneously.

FIG. 3B shows another stage of formation of a vertical memory cell subsequent to the formation the vertical memory cell structure 356 shown in FIG. 3A. FIG. 3B shows a vertical memory cell structure 358. According to some embodiments, vertical memory cell structure 358 includes the vertical memory cell structure 356 shown in FIG. 3A with spaces around the semiconductor structure, e.g., the trenches and volumes 377, filled with an insulator material 380. Insulator material 380 and other insulative materials described herein can be a high-k dielectric material that may be formed of, for example, silicon dioxide, hafnium oxide, and other oxides, silicates, or aluminates of zirconium, aluminum, lanthanum, strontium, titanium, or combinations thereof including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $LaSiO_X$, $YSiO_X$, $ScSiO_X$, $CeSiO_X$, $HfLaSiO_X$, $HfAlO_X$, $ZrAlO_X$, and/or $LaAlO_X$. In addition, multi-metallic oxides may be used, such as hafnium oxynitride, iridium oxynitride, and/or other high-k dielectric materials in either single or composite combinations.

For example, the insulator material 380 can be deposited over the vertical memory cell structures 356, with excess insulator material 380 being removed by a post-deposition process such as chemical-mechanical polishing (CMP). The insulator material 380 can be formed, for example, as an oxide and/or other insulating material. For illustrative purposes, the volume 377 of materials 332 and 334 in the vicinity of junction 333 by which the first region is reduced is not shown filled-in with the insulator material 380, but the end view of the vertical memory cell structure 358 shows how insulator material 380 can occupy the reduced volume 377 on each sidewall.

FIG. 3C shows another stage of formation of a vertical memory cell subsequent to the formation the vertical memory cell structure 358 shown in FIG. 3B. FIG. 3C shows a vertical memory cell structure 360. According to some embodiments, vertical memory cell structure 360 includes trenches 381 formed within the vertical memory cell structure 358 as shown in FIG. 3B. The trenches 381 are formed through material 334 and insulator material 380. Additional hard masking can be added, if needed, corresponding to areas of material 334 and insulator material 380 not to be removed, which in turn correspond to the trenches in order to pattern and etch the trenches as shown.

The trenches 381 are oriented perpendicular to a longest dimension of the semiconductor structures, as shown in FIG. 3A. As such, the trenches 381 are oriented perpendicular to the volumes 377. The trenches 381 are oriented parallel to the second dimension, as described above, such that a portion of material 334 of the semiconductor structures are formed into pillar structures, with insulator material 380 in between pillars that are adjacent in the second dimension.

The trenches 381 can be etched to a depth 382 corresponding to an upper edge of a control gate structure, i.e., upper boundary of the body region 227 where the control gate structure will be later defined. As such, trenches 381 remove bulk material 334 to define the second region of a vertical memory cell, e.g., FIG. 2A at 228. Trenches 381 can be arranged such that the pillar structures have desired second region dimensions. Second and third junctions, e.g., FIG. 2A at 235 and 237 respectively, are located within the second region, e.g., FIG. 2A at 228. Therefore, trenches 381 can be arranged such that the pillar structures have the dimensions desired for the second and third junctions, which will be subsequently-formed. For example, trenches 381 can be arranged such that the pillar structures have dimensions such that cross-sectional areas of the second and third junctions are greater than, equal to, and/or less than a cross-sectional area to which junction 333 will be formed.

FIG. 3D shows another stage of formation of a vertical memory cell subsequent to the formation the vertical memory cell structure 360 shown in FIG. 3C. FIG. 3D shows a vertical memory cell structure 362. According to some embodiments, vertical memory cell structure 362 includes an insulator material spacer 385 deposited on sidewalls of trench 381 to the depth 382, corresponding to the depth to which trench 381 was formed. The insulator material spacer 385 can be an oxide and may be the same or different than insulator material 380, for example.

According to one or more alternative embodiments, sidewalls of trench 381 can be oxidized to form insulator material spacer 385. This alternative oxidation process can be controlled so as to also consume some portion of material 334 to reduce the dimensions of subsequently-formed 393 and 395 (see FIG. 3G). That is, insulator material spacer 385 can correspond to oxidation material 209 shown in FIG. 2B.

Subsequent to deposition of spacer 385 on sidewalls of trench 381, the material 334 and insulator material 380 can be further recessed, such as by etching another trench 384 into the bottom of trench 381. Trench 384 can be etched to a depth 383 corresponding to a lower edge of the subsequently-formed control gate structure and lower boundary of the body region shown in FIG. 2A at 227. That is, etching trench 384 defines dimensions of the body region. The distance 389 between depth 382 and depth 383 corresponds to the vertical dimension of the body region defining the control gate structure height. The width and/or location of trench 384 defines a width of the body region, e.g., FIG. 2A at 234, where the control gate structure will be subsequently defined. As such, trenches 384 remove bulk material 334 to define the body region of a vertical memory cell, e.g., FIG. 2A at 227.

FIG. 3E shows another stage of formation of a vertical memory cell subsequent to the formation the vertical memory cell structure 362 shown in FIG. 3D. FIG. 3E shows a vertical memory cell structure 364. According to some embodiments, vertical memory cell structure 364 includes a gate dielectric 386 formed, e.g., deposited, on the sidewalls and floor of trench 384 (see FIG. 3D) etched into the bottom of trench 381. That is, the gate dielectric material 386 can be deposited over material 334 exposed by the formation of trench 384, including being deposited over the floor of trench 384, as shown in FIG. 3E. According to an alternative embodiment, material 334 exposed by the formation of trench 384 can be oxidized to form a gate dielectric material 386 on the sidewalls and floor of trench 384.

Subsequent to the formation of the gate dielectric material 386 on the sidewalls of trench 384, a conductive material 387 can be deposited over the gate dielectric material 386 on sidewalls of trench 384. According to some embodiments, the conductive material 387 can be a metal. The conductive material 387 can be a control gate electrode configured to be a word line for the vertical memory cell, for instance. Deposition of the conductive material 387 can cause conductive material 387 to also be deposited on the floor of trench 384, e.g., over any gate dielectric material 386 also deposited on the floor of trench 384. A spacer etch can be used to isolate the conductive material 387 on the sidewalls of trench 384 from each other, e.g., so as to separate the gate word lines on adjacent sidewalls of trench 384 from one another.

Formation, e.g., deposition, of conductive material 387 on the gate dielectric material 386 on sidewalls of trench 384 can result in some overlap 388 between the conductive material 387 and the insulator material spacer 385 deposited on sidewalls of trench 381 by some conductive material 387 being deposited above depth 382 (shown in FIG. 3C). Such overlap 388 does not increase the control gate height since the control gate structure is defined by the location of the gate dielectric material 386, which remains at height 389 (shown in FIG. 3D) of trench 384 since the insulation properties and thickness of insulator material spacer 385 do not effectively support control gate operation towards additional charge storage.

FIG. 3F shows another stage of formation of a vertical memory cell subsequent to the formation the vertical memory cell structure 364 shown in FIG. 3E. FIG. 3F shows a vertical memory cell structure 366. According to some embodiments, vertical memory cell structure 366 is formed by etching an additional trench 390 into the bottom of trench 384. The patterning mask 376, e.g., nitride cap, insulator material 380, e.g., oxide, insulator material spacer 385, e.g., oxide, and conductive material 387, e.g., metal, all function as a hard mask for etching trench 390. Etching trench 390 defines the dimensions of the materials 332 and 334 of the semiconductor pillars in the first region (FIG. 2A at 226).

Similar to the etch described with respect to forming the semiconductor structures shown in FIG. 3A, the etch to form trench 390 can be accomplished by, for example, an etch, e.g., reactive ion etch, to the conductive material 374 and/or buried oxide 372 between the instances of the conductive material 374. Those portions of the material 334 of the semiconductor pillars are protected from etching to a location corresponding to a bottom edge of the control gate structures, e.g., lower edge of the conductive material 387. In other words, the patterning mask 376, insulator material 380, insulator material spacer 385, and conductive material 387, protect the portion of the material 334 outside the first region, e.g., FIG. 2A at 226.

The etch to the conductive material 374 and/or buried oxide 372 associated with the formation of trench 390 removes not only bulk materials 332 and 334 that do not correspond to respective conductive material 374, but also some volume of the bulk materials 332 and 334 that do correspond to respective conductive material 374. That is, the reactive ion etch to the conductive material 374 and/or buried oxide 372 can reduce a volume of the first region relative to the body region, which is covered and protected. The reactive ion etch to the buried oxide 372 undercuts the materials 332 and 334 of the semiconductor structure in a dimension perpendicular to the dimension in which volume 377 (shown FIG. 3A) was removed. FIG. 3F indicates the orientation of a first dimension 399 and a second dimension 398. Dimension 399 is oriented so as to correspond with the direction along which widths 248, 252, and 254 are shown in FIG. 2A.

Therefore, the reactive ion etch to the conductive material 374 and/or buried oxide 372 in the formation of trench 390 removes a volume of materials 332 and 334 corresponding to a respective conductive material 374 in dimension 399, undercutting the materials 332 and 334 in the first region. The volume of the first region being reduced relative to the body region is shown in FIG. 3F at 391. Such volume reduction can occur on opposite sidewalls of each instance of the semiconductor pillars. Reducing the volume 391 of the first region relative to the body region in this manner operates to reduce the cross-sectional area of junction 333, e.g., a P-N junction, since the first region includes junction 333. According to some embodiments, junction 333 is a junction between P-base body material and cathode material for a vertical memory cell.

Reducing the volume 391 of the first region relative to the body region reduces another of the dimensions associated with the cross-sectional area of junction 333, e.g., corresponding to width 252 shown in FIG. 2A, without reducing the volume of the body region, e.g., FIG. 2A at 227. As can be seen in FIG. 3F, the volume of the first region, and therefore the cross-sectional area of junction 333, can be reduced in each dimension of the cross section by the techniques described by the present disclosure.

Figure 3G:
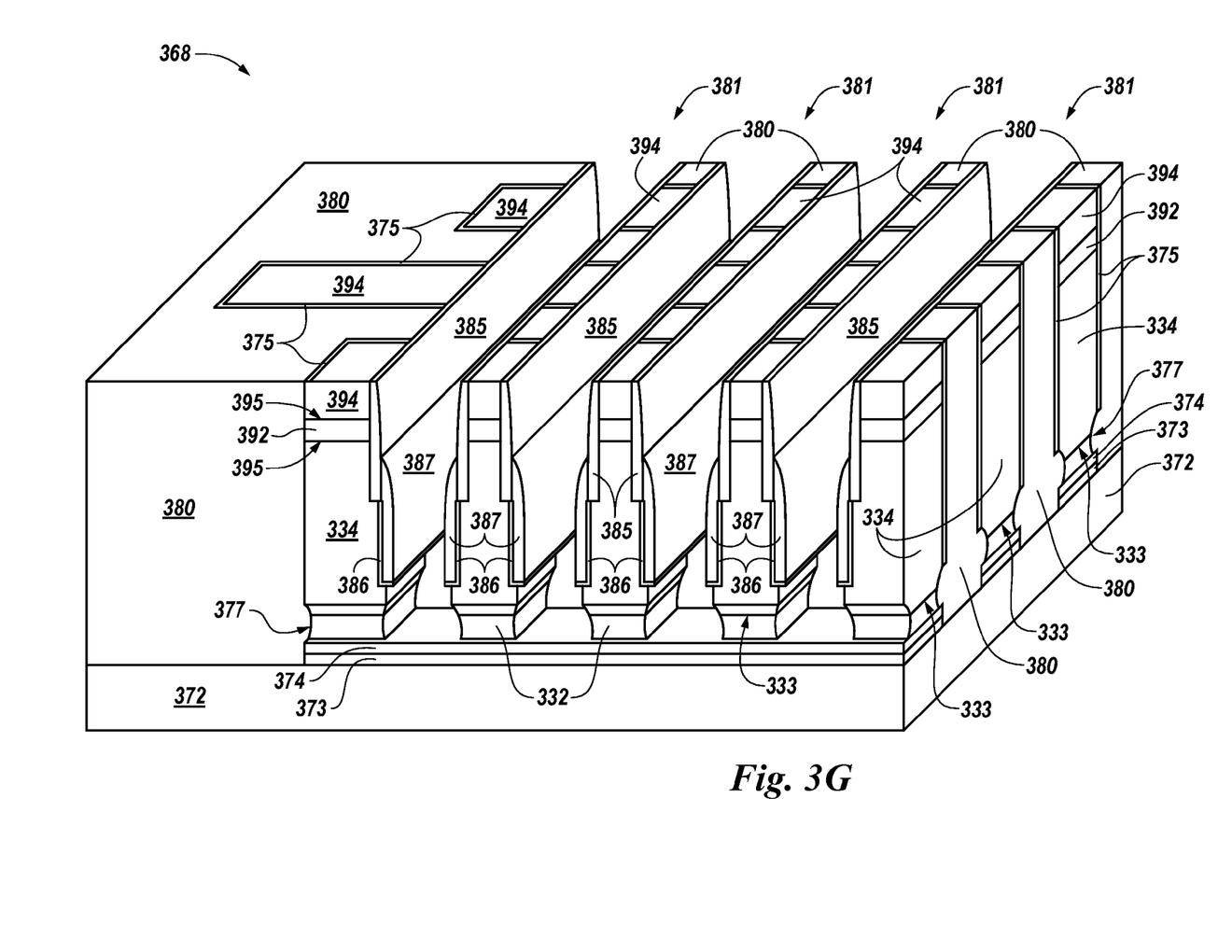

FIG. 3G shows another stage of formation of a vertical memory cell subsequent to the formation the vertical memory cell structure 366 shown in FIG. 3F. FIG. 3G shows a vertical memory cell structure 368. According to some embodiments, vertical memory cell structure 368 reflects processing to remove the patterning mask 376, e.g., nitride cap, and implantation of dopants to transform one portion of material 334 into doped material 392, and another portion into doped material 394. For example, an N-base implant process can be performed to create an N-based doped material 392 adjacent the lightly doped P-base material 334, with junction 393 therebetween. A P+ implant process can be performed to create a P+ doped material 394 adjacent the N-based doped material 392, with junction 395 therebetween. According to some embodiments, doped material 394 can be an anode of a vertical memory cell. After implantation of the above-described dopants, activation of the doping can be accomplished.

Figure 3H:
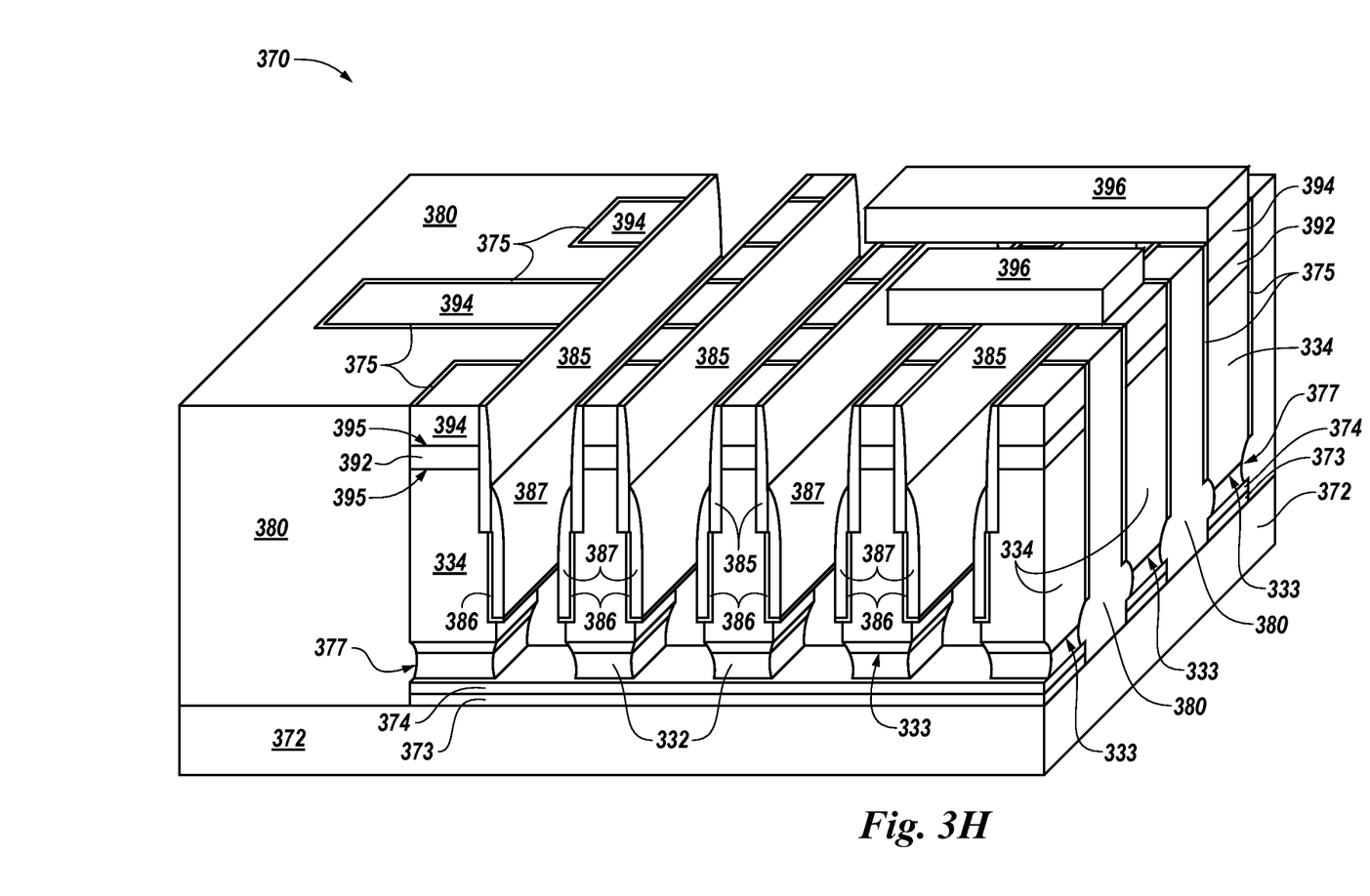

FIG. 3H shows another stage of formation of a vertical memory cell subsequent to the formation the vertical memory cell structure 368 shown in FIG. 3G. FIG. 3H shows a vertical memory cell structure 370. According to some embodiments, vertical memory cell structure 370 includes formation of a contact material, e.g., 244 shown in FIG. 2A, on doped material 394 (shown in FIG. 2A at 244) and a conductive, e.g., metal, material 396. According to various embodiments, the conductive material 396 can be an anode line of a vertical memory cell. The contact material can be formed between doped material 394 and the conductive material 396.

A vertical memory cell can have junctions adjacent a body region that have cross-sectional areas that are less than a cross-sectional area of the body. In this manner, capacitance across the junction(s) can be reduced (relative to a junction having a same cross-sectional area as the body region). Lower capacitance across a junction can reduce an amount of charge stored in the body region lost across the junction via the capacitance leakage path thereby improving retention characteristics of the vertical memory cell. Furthermore, reducing junction capacitance in this manner relative to gate capacitance also improves vertical memory cell operating performance. The cross-sectional area of a junction in a region adjacent the body region can be reduced by reducing the volume of semiconductor materials in the vicinity of the junction during formation of the vertical memory cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a vertical memory cell, comprising:
    forming a semiconductor structure over a conductor line, the semiconductor structure having a first region directly below a body region, wherein the first region includes a first junction between first and second doped materials; and
    reducing a cross-sectional area of the first region relative to a cross-sectional area of the body region, wherein the first region is smaller than the body region in a first dimension;
    reducing the cross-sectional area of the first region relative to the cross-sectional area of the body region, wherein the first region is smaller than the body region in a second dimension, and wherein the second dimension is orthogonal to the first dimension; and
    forming a gate structure adjacent the body region,
    wherein reducing the cross-sectional area of the first region relative to the cross-sectional area of the body region includes etchings.

2. The method of claim 1, wherein reducing the cross-sectional area of the first region relative to the body region in at least one of the first and second dimensions includes etching by a reactive ion etch.

3. The method of claim 1, further comprising:
    forming an etch-protective material on a first pair of sidewalls of the semiconductor structure above the first region; and
    forming an etch-protective conductive material on a second pair of sidewalls of the semiconductor structure above the first region,
    wherein reducing the cross-sectional area of the first region relative to the body region such that the first region is smaller than the body region in at least one of the first and second dimensions includes etching by a reactive ion etch.

4. The method of claim 1, further comprising:
    implanting the semiconductor structure to create a second junction between the second doped material and a third doped material in a second region above the body region; and
    reducing a cross-sectional area of the second region relative to the body region, wherein the second region is smaller than the body region in the second dimension.

5. The method of claim 1, further comprising:
    implanting the semiconductor structure to create a second junction between the second doped material and a third doped material in a second region above the body region; and
    reducing a volume of the second region relative to the body region of the semiconductor structure in the second dimension.

6. A vertical memory cell formed by the method of claim 1.

7. A method of forming a vertical memory cell, comprising:
    forming a semiconductor structure over a conductor line, the semiconductor structure having a first region that includes a first junction between first and second doped materials;
    reducing, by etchings, a cross-sectional area of the first region relative to a cross-sectional area of a body region of the semiconductor structure, wherein the first region is smaller than the body region in a first dimension and a second dimension; and
    forming a plurality of semiconductor pillars from the semiconductor structure,
    wherein the second dimension is orthogonal to the first dimension, and
    wherein the first region is directly below the body region and closer to the conductor line than the body region.

8. A method of forming a vertical memory cell, comprising:
- forming a semiconductor structure over a conductor line, the semiconductor structure having a first region that includes a first junction between first and second doped materials;
- reducing a volume of the first region relative to a body region of the semiconductor structure in a first dimension;
- forming a plurality of semiconductor pillars from the semiconductor structure; and
- reducing a volume of the first region relative to the body region in a second dimension, wherein the second dimension is orthogonal to the first dimension,
- wherein forming a plurality of semiconductor pillars from the semiconductor structure includes:
- filling spaces around the semiconductor structure with an insulator material;
- forming an etch-protective material on a first pair of sidewalls of the semiconductor structure above the first region;
- etching the semiconductor structure and insulator material to form a first trench oriented substantially perpendicular to the semiconductor structure, the first trench being in a second region extending to a depth corresponding to a first gate edge, wherein the body region is closer to the conductor line than the second region;
- depositing an insulator material spacer on sidewalls of the first trench;
- etching the semiconductor structure to form a second trench at a bottom of the first trench, the second trench being in the body region and extending to a depth of a second gate edge;
- forming a gate dielectric on sidewalls of the second trench;
- depositing a conductive material over the gate dielectric on sidewalls of the second trench; and
- etching the semiconductor structure to form a third trench at a bottom of the second trench, the third trench being in the first region and extending to the conductor line.

9. The method of claim 8, wherein etching the semiconductor structure and insulator material to form a first trench includes reducing a volume of the second region relative to the body region in the second dimension.

10. The method of claim 8, wherein etching the semiconductor structure and insulator material to form a first trench includes reducing a volume of the second region relative to the first region in the second dimension.

11. The method of claim 8, further comprising:
- implanting the semiconductor structure to form a third doped material above the second doped material in the second region; and
- implanting the semiconductor structure to form a fourth doped material above the third doped material in the second region,
- wherein the first doped material is an N+ doped material, the second doped material is a doped P-base material, the third doped material is an N-base material, and the fourth doped material is a P+ doped material.

* * * * *

UNITED STATES PATENT AND TRADEMARK OFFICE
CERTIFICATE OF CORRECTION

| | | |
|---|---|---|
| PATENT NO. | : 8,609,492 B2 | Page 1 of 1 |
| APPLICATION NO. | : 13/192207 | |
| DATED | : December 17, 2013 | |
| INVENTOR(S) | : Kurt D. Beigel et al. | |

It is certified that error appears in the above-identified patent and that said Letters Patent is hereby corrected as shown below:

On the title page, item (57), in "Abstract", in column 2, line 1, delete "forming," and insert -- forming --, therefor.

Signed and Sealed this
Twenty-fifth Day of March, 2014

Michelle K. Lee
*Deputy Director of the United States Patent and Trademark Office*